United States Patent
Lu et al.

(10) Patent No.: US 8,257,795 B2
(45) Date of Patent: Sep. 4, 2012

(54) NANOSCALE METAL PASTE FOR INTERCONNECT AND METHOD OF USE

(75) Inventors: Guo-Quan Lu, Blacksburg, VA (US);
Guangyin Lei, Blacksburg, VA (US);
Jesus Calata, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 1156 days.

(21) Appl. No.: 12/019,450

(22) Filed: Jan. 24, 2008

(65) Prior Publication Data
US 2009/0162557 A1 Jun. 25, 2009

Related U.S. Application Data

(63) Continuation-in-part of application No. 10/589,399, filed as application No. PCT/US2005/004567 on Feb. 14, 2005, now abandoned.

(60) Provisional application No. 60/545,139, filed on Feb. 18, 2004.

(51) Int. Cl.
*B05D 3/02* (2006.01)
*B22F 7/02* (2006.01)

(52) U.S. Cl. ........... 427/383.3; 419/8; 419/9; 427/383.1

(58) Field of Classification Search ................... 419/8, 9; 427/383.1, 383.3
See application file for complete search history.

(56) References Cited

U.S. PATENT DOCUMENTS

| | | | |
|---|---|---|---|
| 4,333,966 A | 6/1982 | Deffeyes et al. | |
| 4,810,672 A | 3/1989 | Schwarzbauer | |
| 5,855,820 A | 1/1999 | Chan et al. | |
| 5,882,722 A | 3/1999 | Kydd | |
| 6,114,413 A | 9/2000 | Kang et al. | |
| 6,372,158 B1 | 4/2002 | Hashimoto et al. | |

(Continued)

FOREIGN PATENT DOCUMENTS

CN 1361656 A 7/2002

(Continued)

OTHER PUBLICATIONS

Wong Wai Kwan et al. "Low temperature sintering process for deposition of nano-structured metal for nano IC packaging". Electronics Packaging Technology, 2003 pp. 551-556.

(Continued)

*Primary Examiner* — Jessica L Ward
*Assistant Examiner* — Alexander Polyansky
(74) *Attorney, Agent, or Firm* — Blank Rome LLP

(57) ABSTRACT

A paste including metal or metal alloy particles (which are preferably silver or silver alloy), a dispersant material, and a binder is used to form an electrical, mechanical or thermal interconnect between a device and a substrate. By using nanoscale particles (i.e., those which are less than 500 nm in size and most preferably less than 100 nm in size), the metal or metal alloy particles can be sintered at a low temperature to form a metal or metal alloy layer which is desired to allow good electrical, thermal and mechanical bonding, yet the metal or metal alloy layer can enable usage at a high temperature such as would be desired for SiC, GaN, or diamond (e.g., wide bandgap devices). Furthermore, significant application of pressure to form the densified layers is not required, as would be the case with micrometer sized particles. In addition, the binder can be varied so as to insulate the metal particles until a desired sintering temperature is reached; thereby permitting fast and complete sintering to be achieved.

16 Claims, 8 Drawing Sheets

U.S. PATENT DOCUMENTS

| | | | |
|---|---|---|---|
| 6,781,304 B2 | 8/2004 | Yano et al. |
| 7,405,156 B2 | 7/2008 | Tanaka |
| 2002/0079135 A1 | 6/2002 | Yazaki et al. |
| 2003/0108664 A1 | 6/2003 | Kodas et al. |
| 2004/0219730 A1 | 11/2004 | Basol |
| 2004/0245648 A1 | 12/2004 | Nagasawa et al. |

FOREIGN PATENT DOCUMENTS

| | | | |
|---|---|---|---|
| JP | 07126556 A | 5/1995 |
| JP | 07126556 A | 5/1995 |
| JP | 2002151535 | 5/2002 |
| JP | 2002334618 A | 11/2002 |
| JP | 2008010703 | 1/2008 |
| WO | WO-2004005413 A1 | 1/2004 |
| WO | 2004026526 | 4/2004 |

OTHER PUBLICATIONS

Zhang Zhiye et al. "Nanoscale silver sintering for high-temperature packaging of semiconductor devices". Materials Processing and Manufacturing Division, 2004, pp. 129-135.

Bai, et al., "Low-Temperature Sintered Nanoscale Silver as a Novel Semiconductor Device-Metallized Substrate Interconnect Material," IEEE Transactions on Components and Packaging Technologies, Sep. 2006, pp. 589-593, vol. 29, No. 3, Washington, DC, USA.

Bai, "Low Temperature Sintering of Nanoscale Silver Paste for Semiconductor Device Interconnection," dissertation submitted to the faculty of the Virginia Polytechnic Institute and State University, 2005, 196 pp., Blacksburg, VA, USA.

Bai, et al., "Thermomechanical Reliability of Low-Temperature Sintered Silver Die Attached SiC Power Device. Assembly," IEEE Transactions on Device and Materials Reliability, Sep. 2006, pp. 436-441, vol. 6, No. 3, IEEE, Washington, DC, USA.

Yan, et al., "Microstructure of Surface Layers in Cu (in,Ga)Se2 Thin Films," NREL National Renewable Energy Laboratory, May 2003, 2 cover pages and pp. 1-4, U.S. Department of Energy, Oak Ridge, TN, USA.

Kwan, et al., "Low Temperature Sintering Process for Deposition of Nano-Structured Metal for Nano IC Packaging," 2003, pp. 551-556, Electronics Packaging Technology,Washington, DC, USA.

Zhang, et al., "Nanoscale Silver Sintering for High-Temperature Packaging of Semiconductor Devices," Materials Processing and Manufacturing Division Fifth Global Symposium, 2004, pp. 129-135, The Minerals, Metals & Materials Society, Warrendale, PA, USA.

Zhang, et al., "Nanoscale Silver Sintering for High-Temperature Packaging of Semiconductor Devices." The Minerals, Metals & Materials Society, 2004, 5 pp., Warrendale, PA, USA.

E. Ide, et al., "Metal-Metal Bonding Process Using Ag Metallo-Organic Nanoparticles;" Acta Materialia 53 (2005) 2385-2393, published by Elsevier Ltd., 2005.

Zhang et al., "Pressure-Assisted Low-Temperature Sintering of Silver Paste as an Alternative Die-Attach Solution to Solder Reflow," IEEE Transactions on Electronics Packaging Manufacturing, vol. 25, No. 4, Oct. 2002, pp. 279-283.

Heard et al., "The Characterization of Ag Sols by Electron Microscopy, Optical Absorption, and Electrophoresis," Journal of Colloid and Interface Science, vol. 93, No. 2, Jun. 1983, pp. 545-555.

Meldrum et al., "Utilization of Surfactant-Stabilized Colloidal Silver Nanocrystallites in the Construction of Mono- and Multiparticulate Lanngmuir—Blodgett Films," Langmuir, vol. 10, No. 7, Jul. 1994, pp. 2035-2040.

Chuang et al., "Silver-Indium Joints Produced at Low Temperature for High Temperature Devices," IEEE Transactions on Components and Packaging Technologies, vol. 25, No. 3. Sep. 2002, pp. 453-458.

Schwarzbauer et al., "Novel Large Area Joining Technique for Improved Power Device Performance," IEEE Transactions on Industry Applications, vol. 27, No. 1, Jan./Feb. 1991, pp. 93-95.

Bai et al., "High-Temperature Operation of SiC Power Devices by Low-Temperature Sintered Silver Die-Attachment," IEEE Transactions on Advanced Packaging, vol. 30, No. 3, Aug. 2007, pp. 506-510.

Qi et al., "Effect of Interconnection Area on Shear Strength of Sintered Joint with Nano-Silver Paste," Soldering and Surface Mount Technology, vol. 20, No. 1, 2008, pp. 8-12.

Bai et al., "Processing and Characterization of Nanosilver Pastes for Die-Attaching SiC Devices," IEEE Transactions on Electronics Packaging Manufacturing, vol. 30, No. 4, Oct. 2007, pp. 241-245.

Sintered Nanoscale Silver  2μm micrsilver  2μm

2μm
100 nm Nano-Ag
PVB 450oC

2μm
100 nm Nano-Ag
PRV914 450oC

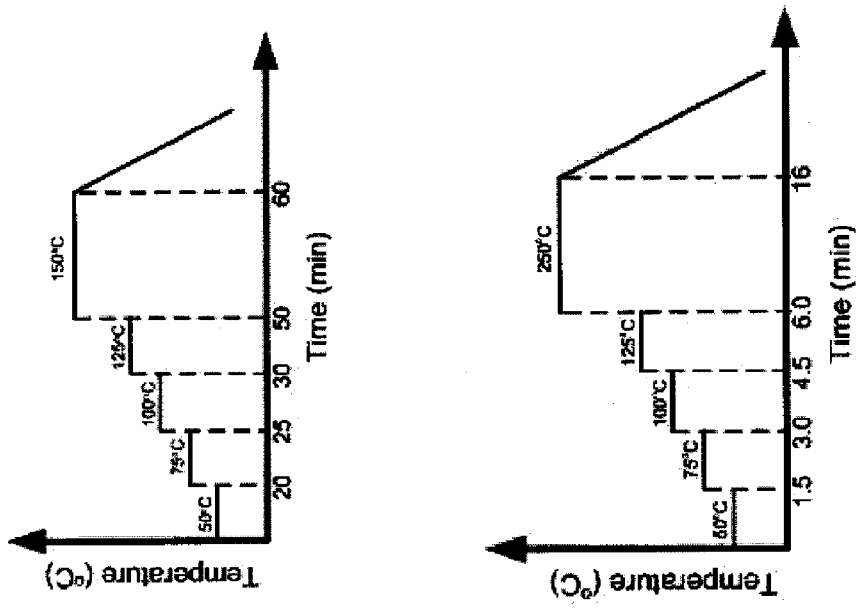
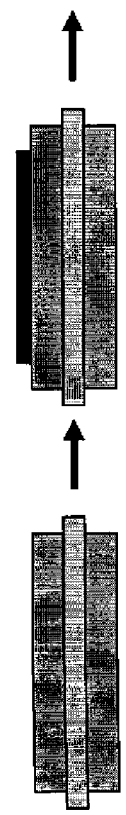
Fig. 9a
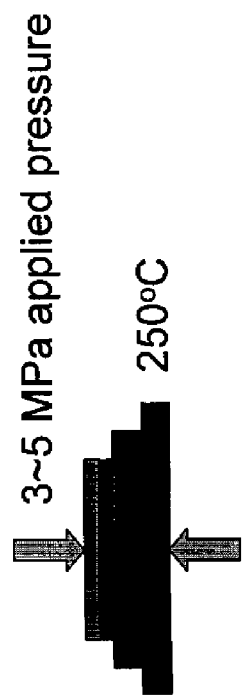
Fig. 9b
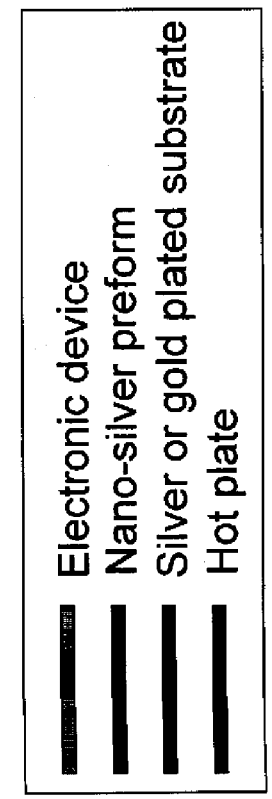

NANOSCALE METAL PASTE FOR INTERCONNECT AND METHOD OF USE

STATEMENT OF PRIORITY

This application is a continuation-in-part of U.S. patent application Ser. No. 10/589,399, filed on Aug. 14, 2006, now abandoned published as U.S. Patent Application Publication No. 2007/0183920, which claims priority to the PCT Application No. PCT/US2005/004567, filed Feb. 14, 2005, which in turn is a 371 of U.S. Provisional Application Ser. No. 60/545,139, filed Feb. 18, 2004. The disclosure of these applications is hereby incorporated by reference herein.

STATEMENT OF GOVERNMENT SUPPORT

This invention was made partially with U.S. Government support from a U.S. Army Research Laboratory grant under Contract No. W911NF-05-2-0033. The U.S. Government has certain rights in the invention.

BACKGROUND OF THE INVENTION

1. Field of the Invention

The present invention generally relates to materials used for interconnecting electronic devices and, particularly, devices which either generate high temperatures during use or devices which are used in high temperature applications. Furthermore, the invention is generally related to a fabrication method which reduces or eliminates the need for high pressure application during fabrication of an interconnection, such as during die attach.

2. Background Description

All semiconductor chips have to be fastened or attached to a substrate to function in an electronic product. The state-of-the-art technology for interconnecting these chips typically uses a lead or lead-free solder alloy, or a conductive polymeric glue, such as an epoxy. However, these materials have poor thermal properties and do not dissipate the heat generated by the chips. They also have poor electrical properties and fail to effectively reduce loss of electrical power, and poor robustness for mechanical strength and reliability. Furthermore, because of the low melting temperatures of solder alloys and low decomposition temperatures of epoxies, these materials may not be generally suitable for allowing some chips, such as SiC or GaN chips, to function at high temperatures.

Sintering of microscale metal powder paste is commonly used in hybrid electronic packages for producing electrical circuit patterns. However, the high processing temperatures (>600° C.) prevent its use in joining electronic components to substrates. The current practice is to use solder that is reflowed at temperatures low enough for the devices to withstand. The advantage of low melting temperatures becomes a liability for solder alloys because they cannot meet the requirements of high temperature operation or use in high temperature applications. Furthermore, solder materials have relatively poor electrical and thermal properties, and poor fatigue resistance, compared to other metals such as copper and silver, which detrimentally affect the performance of the whole electronic system.

Pressure-assisted sintering using commercial silver metal paste to attach electronic components was discussed in Zhang et al., "Pressure-Assisted Low-Temperature Sintering of Silver Paste as an Alternative Die-Attach Solution to Solder Reflow", IEEE Transactions on Electronics Packaging Manufacturing, vol. 25, no. 4, October, 2002 (pp 279-283); and Zhang et al., "Pressure-Assisted Low Temperature Sintering of Silver Paste as an Alternative Die-Attach Solution to Reflow", The Fifth International IEEE Symposium on High Density Packaging and Component Failure Analysis in Electronics Manufacturing (HDP 2002) The metal powder in commercial silver metal paste typically has a particle size in the micrometer range. Because of the large particle size, a high sintering temperature is required (600° C. and up) under normal firing conditions. At reduced firing temperature, a large pressure is applied on the assembly to assist the sintering process. However, the application of pressure can be undesirable because of increased difficulty in manufacturing with a corresponding increase in the production cost. Applying pressure also increases the likelihood of damage to the device during processing.

SUMMARY OF THE INVENTION

It has been discovered that by using very fine conductive metal and metal alloy particles on the order of 500 nm or less, and most preferably on the order of 100 nm or less (e.g., 1-100 nm), densified metallic interconnections can be established by relatively low temperature sintering with reduced or no pressure application being required. The materials of this invention can be applied and processed like a solder paste or epoxy (e.g., dispensing, stencil/screen printing, etc.). However, the thermal, electrical and mechanical properties of the joint formed with the fine powders and compositions thereof are far superior to those of traditional lead or lead free solders, epoxy materials, and even micron sized powders (sintered at low temperature).

By using metal particles in the nanoscale range, it is possible to both reduce the bonding temperature (i.e., the sintering temperature in the context of the present invention), and to eliminate or reduce the need for high applied pressure. Without the need for high applied pressure, it is thus possible to make use of existing hybrid microelectronics processing techniques and fabrication equipment and, therefore, enable mass manufacturing of such components. The nanopowder of the present invention can be prepared using known techniques, or purchased directly at a price comparable to that that of micron-size powder. A dispersant is preferably used for reducing agglomeration of the particles which could lead to undesirable/low silver particle loading during mixing of the paste. The nanopowder of the present invention, preferably together with the dispersant, can be combined with a polymer binder that preferably has a volatilization temperature below the desired sintering temperature. Using a binder that preferably does not volatilize until close to the sintering temperature for the metal or metal alloy powder, assists in achieving denser interconnections since sintering occurs more uniformly throughout the composition (i.e., the binder is preferably chosen and formulated into the composition such that the metal or metal alloy powder on the edges closer to the source of heat does not start to fuse with neighboring particles until the bulk of the particles begins to fuse). Dispersion of the metal or metal alloy powder in the binder can be facilitated by ultrasonic or mechanical or methods, or combinations of the same.

Processing conditions that allow for low temperature processing over short time periods have also been discovered. These processing conditions include both a drying and a sintering step, during each of which the temperature is rapidly ramped up. Using the processing conditions of the present invention, effective bonding can be achieved at lower temperature without the need for extended processing times.

The compositions of the present invention have a wide range of applications. For example, they can be used to bond silicon integrated circuit chips in computers, or silicon power chips in power supplies, or optoelectronic chips in telecommunications modules. Also, in the case of silver powder, and silver alloys, where the metal melts at temperatures over 700° C. or 800° C., the invention is suitable for attaching semiconductor chips that can be operated at high temperatures, e.g., SiC or GaN power chips. That is, by sintering silver or silver alloy that is in the form of a nanopowder (one that is less than 500 nm in size, and most preferably below 100 nm in size) at a relatively low temperatures (e.g., on the order of 300° C., a dense, conductive metal interconnection is achieved that can be operated at high temperatures without risking melting of the interconnect, as would be the case with commercial lead and lead free solders as well as conductive epoxies. The ability to allow these chips to operate at a high temperatures cuts down their cooling requirement, leading to savings in materials and energy in the manufacture and operations of the product.

The nanosilver paste of this invention, due to its high melting temperature and low processing temperature, is also useful for applications other than the attachment of silicon devices and heatsinks. It may be used to attach/interconnect wide bandgap devices that need to operate at elevated temperature such as SiC, GaN and diamond. It is also useful for attaching devices that generate substantial amounts of heat such as light-emitting diodes (LED) and semiconductor lasers.

The nanosilver paste of this invention may also be formed into nanosilver preforms for easy handling and application. Nanosilver performs are formed by drying an amount of nanosilver paste on a substrate from which the preform can be easily removed. The preforms can be formed in a variety of sizes and shapes which can be easily applied and further processed when needed.

BRIEF DESCRIPTION OF THE DRAWINGS

The foregoing and other objects, aspects and advantages will be better understood from the following detailed description of a preferred embodiment of the invention with reference to the drawings, in which:

FIGS. 9a and 9b show a schematic of a process for forming a chip attachment with pressure using a specific heating profile.

DETAILED DESCRIPTION OF THE PREFERRED EMBODIMENTS OF THE INVENTION

Figure 1:
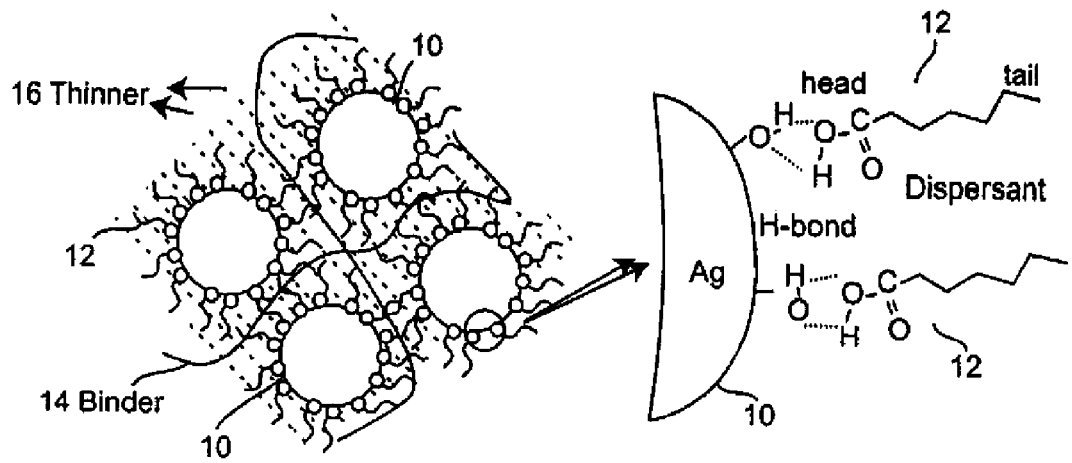
FIG. 1 is a schematic view of metal particles (e.g., nanosilver particles formed as a paste utilizing dispersants to prevent agglomeration and binder to prevent paste cracking during handling and dry processing.

It has been discovered that sintering a nanoscale metal paste is a viable solution to forming electrical interconnect because it enables circumventing the requirements of a high processing temperature and high processing pressure which are required with micrometer sized metal powder. Preferably, the metal powder in the nanoscale metal paste has a particle size less than 500 nm, and most preferably, the particle size is less than 100 nm (e.g., 1-100 nm or 1-60 nm, etc.).

The preferred metal or metal alloy within the practice of this invention is a silver or silver alloy. This is because of a combination of low cost, as compared to gold, and the amenability of being fired in ordinary atmosphere. While it is processed at temperatures comparable to that of solder reflow, it can withstand subsequent exposure to higher temperature, which solder cannot.

Suitable nanosilver powder (e.g., less than 500 or 100 nm in particle size) is commercially available from various suppliers in various sizes at a cost of roughly $1/gram. Exemplary commercial suppliers include Nanostructured & Amorphous Materials, Inc., Inframat Advanced Materials, Inc., Sumitomo electric U.S.A., Inc., and Kemco International Associates. Nanosilver powder has been used in a variety of applications. For example, silver can be used as an antibacterial additive to fabric products such as carpets, napkins and surgical masks. Silver has been medically proven to kill a wide range of disease causing organisms in the body and is also relatively safe. For this reason, numerous vendors tout the use of silver colloid for attacking bacterial organisms in the body. Samsung also uses silver nanoparticles to enhance food preservation in its refrigerator product lines. Silver nanopowder is also being used as an additive in consumer products such as toothpaste, toothbrush, and soap, as well as socks because of the antibacterial property. In electronic applications, silver nanopowder is being sold for use in conductive traces, resistors, electrodes, optical filters and EMI-shielding. Nanosilver particles are also used as a coloring additive in paints, glass, ink, and cosmetics.

Suitable nanosilver pastes having application in the present invention may also be produced using a modified Carey Lea method. The Carey Lea method was first applied to making photographic emulsions. However, a modified process can be used to synthesize nanosilver particles (see, for example, S. M. Heard, F. Grieser, C. G. Barraclough and J. V. Sanders, J. Colloid Interface Sci. 93 (2): 545-555 1983; and F. C. Meldrum, N. A. Kotov, and J. H. Fendler, "Utilization of surfactant-stabilized colloidal silver nanocraystallites in the constructruction of mono- and multiparticulate Langmuir-Boldgett films", Langmuir 10(7): 2035-2040, 1994). In this technique, a reducing agent is prepared by mixing solutions of sodium citrate and ferrous sulfate. This mixture is added to a solution of silver nitrate under vigorous stirring to form a blue-black precipitate which is recovered by centrifuging the solution. An example for this procedure would be as follows: Preparation of reducing agent by mixing 3.5 ml of 40% $Na_3$citrate.$2H_2O$ and 2.5 ml of freshly prepared 30% $FeSO_4.7H_2O$. This is added to 2.5 ml of 10% $AgNO_3$ solution to precipitate the nanosilver particles.

It will be apparent to those of skill in the art that the invention can be practiced with a wide variety of metal and metal alloy powders. And, in particular, in the case of the preferred silver powder, the composition and technique are not limited to pure silver. In fact, it is common practice to modify the alloy composition and paste components to make them suitable for a wide variety of applications. Often these metals are also of the precious metals type such as Au, Pt and Pd. They do have the effect of raising the firing temperature of the paste and melting point of the alloy, which could be necessary in some cases. A small amount of the palladium (Pd) could be added to silver to prevent the silver migration. Au can also be added to form a gold-silver alloy with still considerably high melting temperature. Adhesion/bonding to the die and substrate can be enhanced with the addition of small amounts of a lower-melting temperature metal such as indium. If present in small amounts, the operating temperature will still be higher than high-temperature solder such as eutectic AuSn, yet can be processed at comparable temperature. Techniques that make use of the presence of indium in the bonding layer have been developed to form high-temperature joints but typically require long processing times (see, for example, R. W. Chuang and C. C. Lee, "Silver-Indium Joints Produced at Low Temperature for High Temperature Devices," IEEE Transactions on Components and Packaging Technologies, 25 (3) (2002) pp 453-458).

With reference to FIG. 1, in one embodiment of the invention, the nanosilver particles 10 are used in a paste which includes a dispersant 12 to disperse the silver particles 10 and prevent agglomeration, a binder 14 to prevent paste cracking during the handling and dry processing, and, in some instances, a thinner 16 to adjust the paste viscosity to allow for screen or stencil printing (the current practice of applying paste to substrates). A wide variety of dispersants 12 can be used in the practice of the invention including fatty acids, fish oils, poly(diallyldimethyl ammonium chloride)(PDDA), polyacrylic acid (PAA), polystyrene sulfonate (PSS), etc.

As shown in FIG. 1, in the case of a fatty acid or fish oil, the dispersant 12 can associate a polar head group with the surface of a nanosilver particle 10 by hydrogen bonding or other means, and the hydrophobic tail serves to space adjacent particles apart from one another and prevent agglomeration. Agglomeration leads to low solid loading and ultimately interconnections of poor electrical, thermal or mechanical properties.

The preferred binder 14 may be a low boiling organic, such as terpineol (bp of 220° C.) that enables unhindered densification of the powder at up to 300° C. Examples of other suitable binders 14 include, for example, polyvinyl alcohol (PVA), polyvinyl butyral (PVB), and wax. The properties of the binder 14 (e.g., volatilization temperature) need to match the sintering kinetics of the nanopowder (i.e., the binder must boil, vaporize, or otherwise decompose below the sintering temperature) and the temperature limitations imposed by the device being attached. As will be discussed in more detail below (see for example, Comparative Example 1 and Example 1), judicious selection of or formulation of binder 14 can be used to assure more uniform sintering of the particles. To reduce viscosity of the paste, which may be required for enabling stenciling and other operations to be performed, a thinner 16, such as RV 912 from Heraus, Inc. may be added. Depending on the choice of binder 14, terpineol may be used as the thinner 16. The choice of thinner is wide ranging, and will depend on the needs of the fabricator, the choice of materials, and other factors. Suitable thinners may include Haraeus HVS 100, texanol, terpineol, Heraeus RV-372, Heraeus RV-507, etc. As with the binder 14, the volatilization temperature of the thinner 16 should match the sintering kinetics of the metal particles 10. The total binder 14 and thinner 16 addition will vary depending on the application and may constitute, for example, up to 20% by weight or more (in certain embodiments, the preferred weight percentage is between 5-20%).

Figure 2:
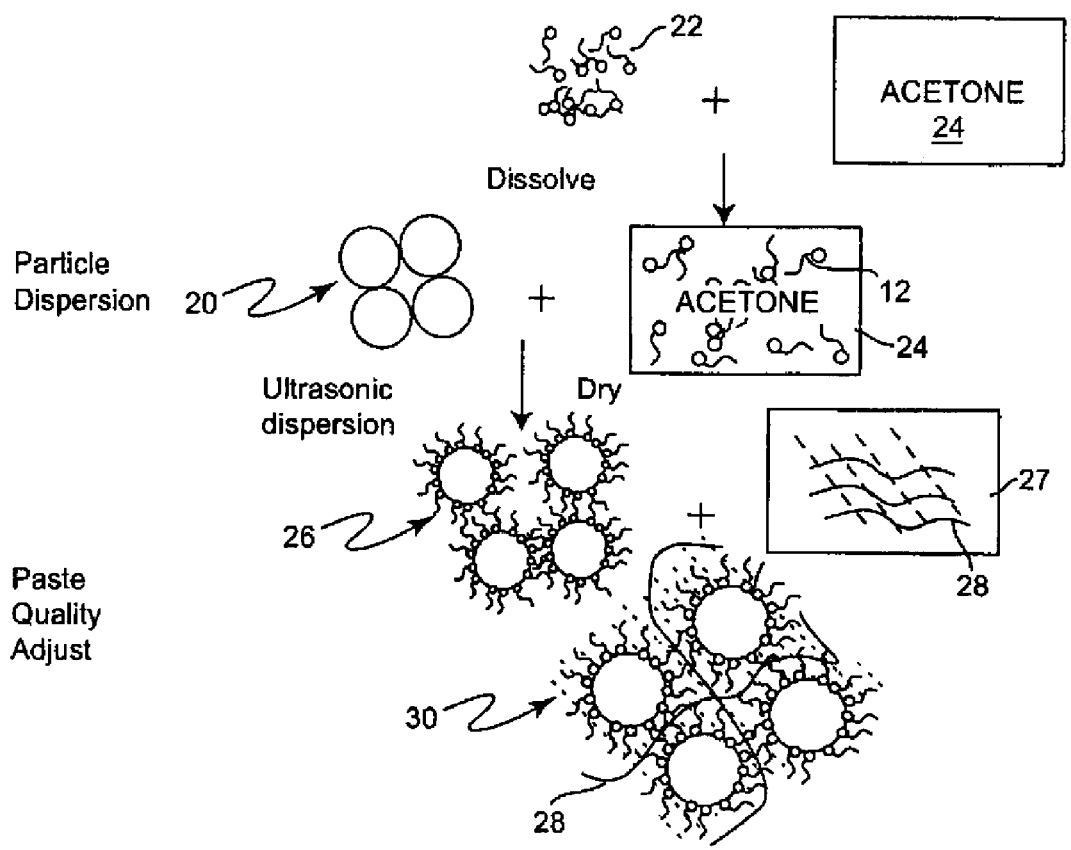
FIG. 2 is a schematic view showing an exemplary two step procedure for formulating a nano scale metal particle paste for use in the present invention.

FIG. 2 shows a two step procedure for formulating a nanoscale metal paste which may be used in the present invention. Commercially obtained metal particles 20, of a size less than 500 nm and most preferably less than 100 nm in diameter, are combined with a fish oil or other suitable dispersant 22 that has been dissolved in acetone 24. This yields a free flowing powder (non-agglomerated) 26 of particles that have dispersant associated on their surfaces. The powder 26 is combined with a solution 27 which includes binder 28 dispersed or dissolved in a carrier such as a thinner, which ultimately yields a paste 30 that includes the metal particles dispersed in the binder material. Dispersion of the metal particles can be aided by immersion in an ultrasonic bath using a room temperature or cold water bath to prevent heating and sintering of the metal powder. Additionally, mechanical mechanisms for stirring, vibrating, etc., can be used to assist in dispersing the metal particles in the binder. In the process shown in FIG. 2, excess acetone can significantly aid in a fatty acid dispersant dispersing silver particles during ultrasonic treatment. Further, the nonpolar acetone is easily separated from a mixture of silver plus fatty acid without a centrifuge. The process of FIG. 2 has the advantage of making control of paste quality easier since the particle dispersing step is separate from the paste quality adjustment.

While FIG. 2 illustrates the dissolved dispersant being combined with the metal particles, it should be understood that the particles made by the Carey Lea method described above may have citrate moieties hydrogen bonded to the surface, and the citrate may serve as a dispersant. Alternatively, the citrate moieties may be displaced by a longer chain fatty acid or fish oil dispersant in a manner similar to that shown in FIG. 2.

Figure 3:
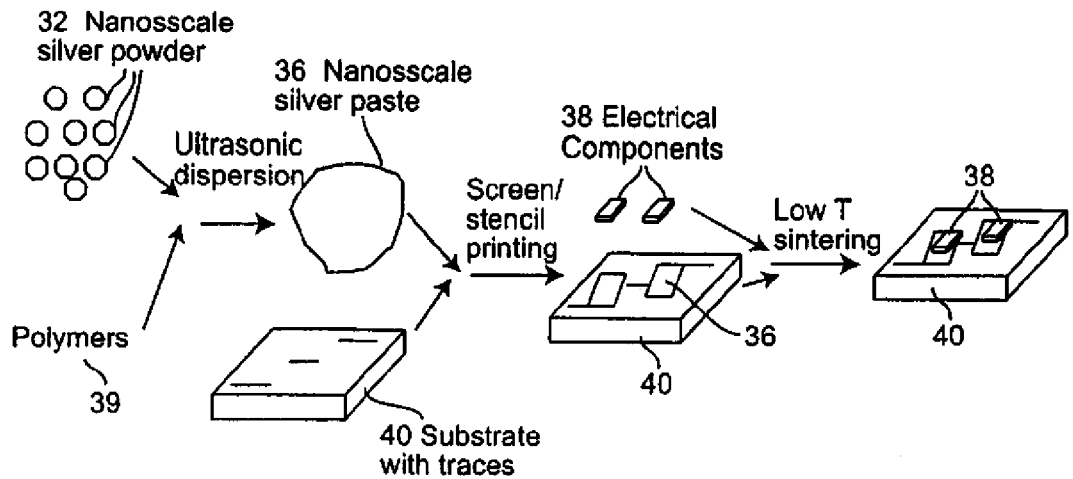
FIG. 3 is a schematic view showing the use of metal paste according to the invention for attachment of devices to a substrate.

FIG. 3 illustrates an exemplary process for attaching electronic components to substrates in the practice of the invention. Initially, a nanoscale silver powder 32 is combined with polymers 34 to form a nanoscale silver paste 36. As discussed in conjunction with FIGS. 1 and 2, dispersing the silver powder in the binder can be enhanced or augmented by ultrasonic methods. The nanoscale silver powder 32 can be converted to a paste 36 form by the addition of an organic solvent with a low boiling point (e.g., terpineol) and thinner (e.g., RV 912 from Heraeus). Electronic devices 38, such as silicon or wide bandgap devices, can be joined to substrates 40 by sintering the nanopowder paste 36 to form a solid bond layer between the devices 38 and mounting substrate 40. The process shown in FIG. 3 may be employed with silver particles, silver alloys, as well as other metals and metal alloys.

Gold and silver plating can be used to improve the interconnection in the practice of this invention. For example, to prevent copper oxidation, since copper oxide cannot form a good bond with silver by interdiffusion, a thin coating of gold or silver can be applied to the bonding site and/or contacts on the device (not shown) prior to screening, stenciling or printing the nanoscale silver past 36. Utilizing a coating of silver or gold will not pose a significant deviation from current practices since the copper substrates in the current commercially available high-performance electronic packages usually are gold coated already.

Except for the low temperature preferably used in the practice of this invention, in certain embodiments of the invention, the methodology of joining electrical devices 38 to substrates 40 is similar to conventional metal paste firing techniques such as those performed for hybrid electronic packages. The firing temperature, due to the size of the metal particles (nano scale (preferably less than 100 nm in diameter) as opposed to micrometer sized), is preferably comparable to solder reflow, and, if required, only a moderate applied force may be necessary to maintain intimate contact with the sintering metal powder layer. As shown in FIG. 3, in certain embodiments of the invention, the nanoscale metal paste is screen or stencil printed on the substrate in the form of a thick film (e.g., 20 to 100 micrometers thick) pattern onto which the device is mounted. After device placement, the die may be pushed down with a moderate force and held in place while sintering takes place. Depending on the thickness of the film, the size of the particles, and the material of the particles (e.g., silver or silver alloy) the sintering time and temperature will vary. In many applications, the sintering temperature will be at least 250° C. and the duration will generally be 2 minutes or longer. Sintering can be carried out in a conventional belt oven in a semi-continuous operation or in a box oven/furnace in a batch type operation. FIG. 3 shows the electrical devices 38 mechanically affixed to the substrate 40 in electrical contact with traces or other contacts after the low temperature sintering operation. As will be discussed in more detail below, the interconnect formed by the process is a dense, conductive metal which can operate at temperatures that are much higher than those used for sintering (e.g., on the order of 600° C., 700° C. or 900° C. or more).

In certain embodiments of the invention, the nanoscale metal paste is processed according to a temperature profile that allows for the effective joining of substrates and electrical devices at relatively low temperatures and relatively short processing times. After the nanoscale metal paste is applied to a substrate, the processes according to these embodiments of the invention are typically performed in two steps.

The first step of the process is typically a drying step. The drying step is usually performed before an electronic device or other surface is brought into contact with the nanoscale metal paste stenciled or screen printed on the substrate. During the drying step, the temperature is increased in increments until a peak drying temperature lower than the required sintering temperature is reached. In certain embodiments of the invention, the peak drying temperature will be no more than 250° C. Typically, the temperature is increased in increments of between 5°-150°, but other increments may be used. After the temperature has been increased, the temperature is maintained for a period of time, typically from 1-20 minutes, before the next temperature increase. This process is repeated until the desired peak drying temperature is reached. After the peak drying temperature is reached, the temperature is typically maintained at the peak for between 1-30 minutes. After drying, the temperature is cooled until the substrate and layer of dried paste are at a temperature suitable for handling.

The second step of the process is typically a sintering step. Before sintering, electronic devices or other surfaces to be bonded are brought into contact with the dried nanoscale metal paste layer. In certain embodiments, especially when pressure is not used during sintering, an additional layer of nanoscale metal paste may be stenciled or screen printed on top of the dried nanoscale paste layer. The temperature is then increased in increments until a desired sintering temperature is reached. The sintering temperature is typically 250° C. or higher. Typically, the temperature is increased in increments of between 5°-150°, but other increments may be used. After the temperature has been increased, the temperature is maintained for a period of time, typically from 30 seconds to 10 minutes, before the next temperature increase. This process is repeated until the desired sintering temperature is reached. After the sintering temperature is reached, the temperature is typically maintained at the peak for between 1-30 minutes. The sintering temperature is typically 250° C. or greater, including up to an greater than sintering temperatures known in the art. The sintering step may or may not be performed along with the application of a small pressure on the electronic device, depending on the surface area being sintered. If a pressure is applied, it is typically between 1-10 MPa. Further, if pressure is applied, the peak drying temperature required in the drying step of the process may be lower than if pressure is not applied in the sintering step. After sintering, the temperature is cooled until the bonded substrate and devices can be handled.

Specific, non-limiting examples of drying and sintering temperature profiles can be found in the Examples below.

In other embodiments of the invention, the nanoscale metal paste may be formed in a preform that can be used for further application. Typically, the preforms of the present invention are formed by stenciling a layer of nanoscale metal paste in a desired amount and shape on a surface that allows for the easy removal of the preform. Typically, this will be a polished surface such as a polished silicon wafer. After the nanoscale metal paste is stenciled onto the surface, it may then be dried to form a preform. A drying process, such as those described herein as well as those known in the art, can then be used to dry the nanoscale metal paste to form a preform. After the nanoscale metal paste has been suitably dried, the preform may be removed from the surface. Removal of the preform may be done using ultrasonic agitation, by floating the preform off of the surface with a liquid, or by physically contacting the preform.

The preforms of the present invention may then be used for bonding as described herein. The preforms may be stored and used at a later date. Because the preforms are already dried in a specific shape, they are convenient to apply to surfaces to be bonded, as there is no need to mix the nanoscale paste or to apply it in paste form. Further, as the preforms are already dried, they require less overall processing time in order to suitably bond surfaces together.

After the preforms of the present invention are applied to the surfaces to be bonded, they may be sintered using the methods described herein or using methods known in the art. The preforms may be sintered both with or without applied pressure.

Comparative Example 1

Nanoscale Silver Paste Versus Micrometer-Size Silver Paste

Figure 4A:
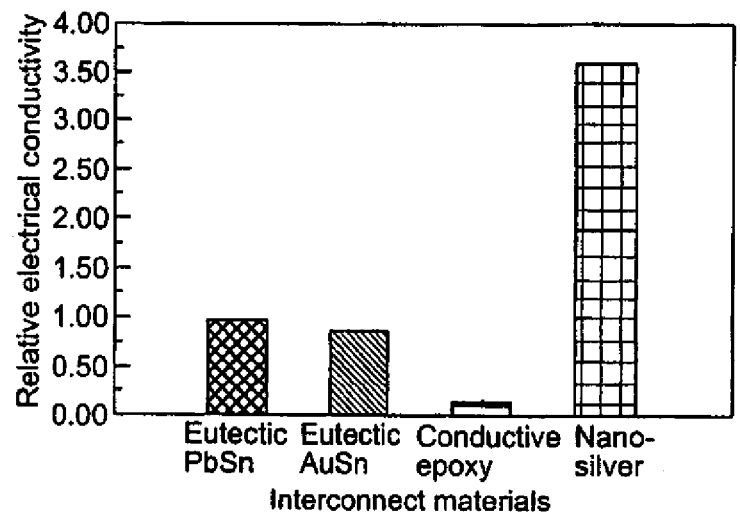
FIGS. 4a-c are graphs showing a comparison of the relative electrical conductivity, relative thermal conductivity, and elastic modulus, respectively, of a various prior art interconnect materials and the interconnect material of the present invention.
Figure 4B:
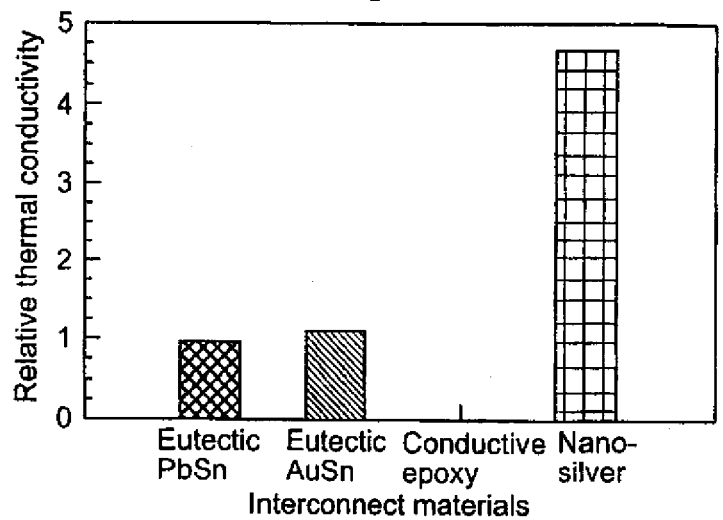
Figure 4C:
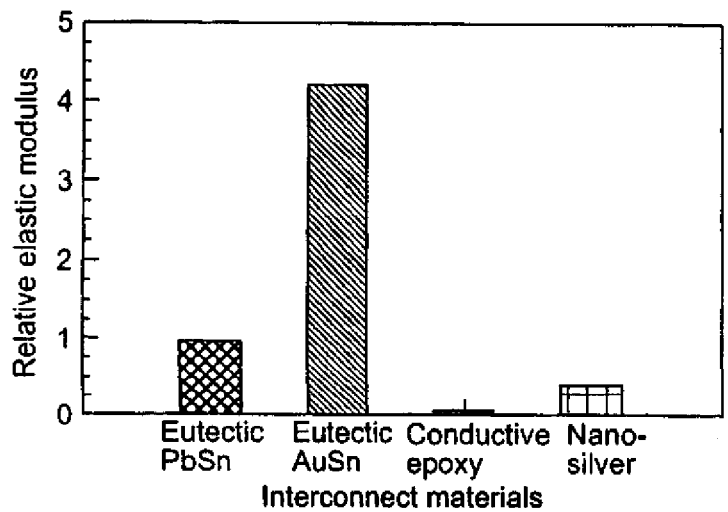

Silver compares favorably with other known interconnect materials such as solder and silver-filled conductive epoxy. Eutectic Pb—Sn solder is used in the vast majority of interconnections although lead-free alternatives are gaining ground. For higher-temperature applications such as bonding of light emitting diodes (LED) and semiconductor lasers, the eutectic AuSn is often recommended because they can go to higher temperatures than Pb-based or Sn-based solders. However, it is a far more expensive solution. Silver-filled conductive epoxies are currently used for silicon device interconnect applications. For example, conductive epoxy is used in International Rectifier's DirectFET™ to secure the silicon dice to a copper cavity. The properties of these materials are listed in Table 1 and some are also shown in FIGS. 4a-c.

temperature will rise accordingly, which could go beyond the desired range and, of course, will no longer be suitable as a solder drop-in replacement. Most of the experimental work performed to date and reported herein, other than commercial Ag paste, has been performed on powder 100 nm or smaller.

TABLE 1

|  | Reflowed eutectic PbSn solder | Reflowed eutectic AuSn solder | Silver filled conductive epoxy | Sintered nano-silver paste |
| --- | --- | --- | --- | --- |
| Composition (wt %) | 37Pb63Sn | 80Au20Sn | Silver filler and resin and hardener | Pure Ag |
| Density | 8.47 g/cm$^3$ | 14.7 g/cm$^3$ | ~3 g/cm$^3$ | 8.58 g/cm$^3$ (~80% of bulk Ag due to porosity) |
| Bonding mechanism | Liquidus reflow | Liquidus reflow | Epoxy curing | Sintering/solidus interdiffusion |
| Peak processing temperatures | 210° C. | 310° C. | ~150° C. | 280° C. |
| Application temperature range | <180° C. | <280° C. | <150° C. | <900° C. |
| Electrical conductivity | 0.69 × 10$^5$ ($\Omega$-cm)$^{-1}$ | 0.62 × 10$^5$ ($\Omega$-cm)$^{-1}$ | ~0.1 × 10$^5$ ($\Omega$-cm)$^{-1}$ | 2.6 × 10$^5$ ($\Omega$-cm)$^{-1}$ |
| Thermal conductivity | 51 (W/K-m) | 58 (W/K-m) | 0.1 (W/K-m) | 240 (W/K-m) |
| Young's modulus | 16 GPA (hard) | 68 GPa (hard) | <1 GPa (soft) | 7 GPa |
| Joint Strength | N/A | 50 MPa | 5-40 MPa | >20 MPa |
| CTE | 25 (PPM/° C.) | 16 (PPM/° C.) | ~25 (PPM/° C.) | 19 (PPM/° C.) |
| Tensile/shear strength | >27 MPa | 275/275 MPa | ~10/10 MPa | 43 MPa |
| Price estimate | $0.1/gram | $40/gram | $4/gram | $4/gram |

Nanoscale silver as used in the practice of the present invention instead of micron-size silver is primarily to lower the sintering temperature to the processing range of most solders. This allows it to be used as a drop-in replacement for these interconnect materials. The sintering temperature is sensitive to the size and morphology of the particles. Silver, which has a very high diffusion rate, is particularly attractive because it can be sintered at well below its melting temperature (962° C.) if the particle size is made small enough. Current silver paste materials must be fired to above 600° C. to obtain reasonable strength and density. The prescribed firing schedule is usually to take the paste to around 900° C. to densify it. However, in the case of the nanoscale silver paste of the present invention where the silver particle is less than 100 nm in size, it can undergo densification starting at as low as 100° C. (although this is not the desirable temperature range).

With the addition of the proper types of dispersant, binder, and solvent, the onset of sintering can be delayed until such time that the preferred firing temperature is reached (~280 to 300° C.) to enable very fast densification rates and attain not only high density, but also good adhesion onto the device and substrate. Therefore, in addition to the reduction in particle size, an important ingredient to the usability of the paste is the selection of the dispersant and binder system that can be volatilized and burned off just below the sintering temperature. If the binder system leaves the paste too early, the silver nanoparticles will start sintering at a lower temperature, and consequently with reduced kinetics, the activation of a non-densifying mechanism, e.g. surface diffusion, occurs resulting in a microstructure that is difficult to densify even at the higher targeted sintering temperature. If the binder system components burn off at a temperature higher than the desired firing temperature, the silver particles will not sinter properly because the polymer components will prevent the widespread contact between particles. A top size of 500 nm (a size that is not traditionally in the size range considered as "nanoscale") is a practical limit for this technique because the sintering FIGS. 4a-b show that the nano-silver pastes of the present invention provide superior relative electrical conductivity and thermal conductivity compared to eutectic PbSn, eutectic AuSn, and conductive epoxy. FIG. 4c shows that the elastic modulus of the sinter nano-silver paste is satisfactory for interconnect applications.

Figure 5A:
FIGS. 5a-b are SEM images of the nanoscale silver paste of the present invention and the commercial silver paste (Heraeus C1075) that has micrometer-sized silver, respectively after the pastes are sintered at 300° C. for ten minutes.
Figure 5B:
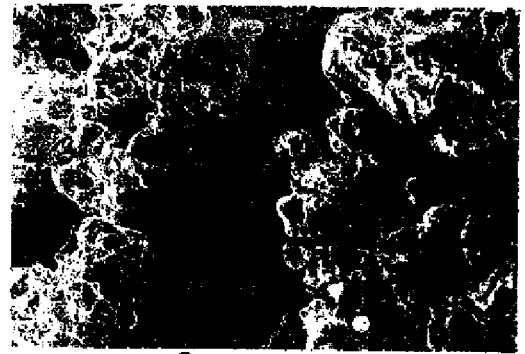

FIGS. 5a and 5b are SEM images of silver pastes sintered at 300° C. for 10 minutes. FIG. 5a shows an SEM image of a sintered nanoscale silver paste according to the present invention, while FIG. 5b shows an SEM image of a sintered commercially available silver paste which includes micrometer sized silver (Heraeus C1075). FIG. 5a shows that a relatively high density (approximately 80%) results from sintering a nanoscale silver paste at 300° C. for ten minutes, which is about two times the green density (silver powder loading only before sintering; organics are not included). FIG. 5b shows that the commercial paste with the micrometer sized silver fired under the same condition. However, the microstructure is very porous, and there is minimal densification. Specifically, the only change in the structure in FIG. 5b is the elimination of the sharp contacts. The annealing out of these features makes the paste difficult to densify.

Figure 6:
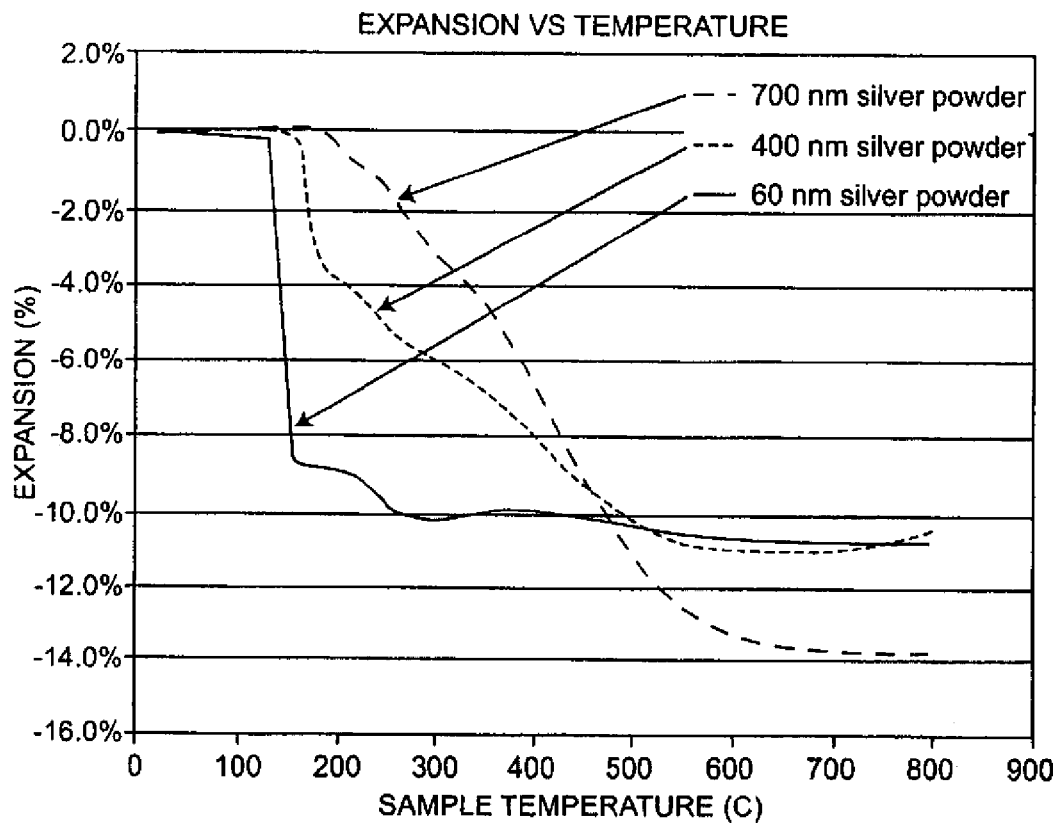
FIG. 6 is a graph showing the expansion/shrinkage curves for different particle sizes of silver that are to be sintered.

FIG. 6 presents a graph obtained from the web site of a commercial supplier of silver powder (see Ferro's web site) which presents the shrinkage of silver powder of various sizes with increasing temperature. The data in this graph, along with the experiments presented herein, demonstrate that the nanoscale silver paste of the present invention can be sintered at lower temperatures with decreasing size.

Comparative Example 2

Comparison of Process for Different Types of Interconnect Materials

Some high-temperature-melting solders are currently used for high-temperature semiconductor device interconnect applications. For example, eutectic Au80Sn20 solder can be reflowed at 310-330° C. and used at a temperature below its melting point 280° C. The major differences between the solder reflow and the nanoscale silver paste sintering of the present invention include:

1) Solder is processed by heating the alloy above its melting temperature to form the bond. The alloy undergoes melting and solidification after the completion of the procedure known as solder reflow. The requirement to melt the alloy means that only those with low melting points are suitable. This restriction also limits the maximum operating temperature of the joint to below the melting point.

2) Conductive epoxy is hardened by curing above room temperature to induce the epoxy to undergo a setting reaction. While the process temperature is low and no melting is involved, the maximum working temperature is limited by the decomposition temperature of the epoxy component, which is in the range of the curing temperature.

3) Attachment/interconnection by nanosilver paste, according to the present invention, is achieved through a sintering process wherein the silver nanoparticles undergo consolidation through diffusion processes rather than by melting. By doing so, high processing temperature is avoided. On the other hand, because the melting point of bulk silver is much higher than the sintering temperature of nanosilver particles, the interconnections can be operated at temperatures higher than the processing temperature. In sum, the nanopowder sintering technique of this invention is a low-temperature bonding solution for high-temperature applications. The sintering temperature can be reduced significantly by making the particle size of the powder smaller. As shown above and as is discussed in comparative example 3, the sintering temperature of silver can be drastically reduced if micrometer-size particles are replaced by nanoscale particles. It is then possible to lower the sintering temperature to that of the reflow temperature of many solder alloys.

Comparative Example 3

Prior Art on the use of Silver Paste Containing Micrometer Sized Silver

Currently available commercial silver/silver alloy pastes contain micrometer-size silver (silver particles larger than 500 nm in size and typically on the order of 10-100 μm in size). Typically, these pastes have to be fired to a high temperature approaching the melting point of the alloy to achieve high density. For example, the recommended firing profile of silver paste is to heat it to around 900° C. (although it is possible to obtain reasonably high density for mechanical strength at lower temperatures, e.g. 700° C.). They are most often used to form conductive traces/patterns (package substrates) and electrodes (capacitors) for various electronics applications. They are not typically used for forming interconnects between devices and substrates, as is proposed in the present application. There are numerous vendors for these products such as DuPont, Heraeus, and Ferro. Silver paste has also been considered as a die-attach and interconnect material. To make it work, an external pressure is applied to the assembly (about 40 MPa) to lower the sintering temperature to 300° C. or lower (see, for example, H. Schwarzbauer, "Method of securing electronic components to a substrate," U.S. Pat. No. 4,810,672; H. Schwarzbauer and R. Kuhnert, "Novel large Area jointing technique for improved power device performance", IEEE Trans. Ind. Appl. 27 (1): 93-95, 1991; and Z. Zhang and G. Q. Lu, "Pressure-assisted low-temperature sintering of silver paste as an alternative die-attach solution to solder reflow", IEEE Trans. Electron. Pack. Manu., 25 (4): 279-283, 2002), which is basically the maximum temperature a semiconductor device can be exposed to without destroying it. However, high applied pressure is not the norm in the packaging industry and could pose serious complications to the attachment/interconnection process, which in turn could lead to more failures (e.g., cracked die) and higher manufacturing costs. It may require major modifications to existing production lines, thus it may not be considered as a drop-in replacement for solder. The higher cost alone may discourage industry from adopting it.

Results for pressure-assisted sintering of commercially available silver paste (micrometer sized) are summarized in Table 2. A reasonably high density (80%) can be attained only if the external pressure on the joint is dramatically increased. This is also accompanied by substantial increases on some key parameter values of the sintered Ag joint such as electrical conductivity, thermal conductivity and shear strength. In contrast, with the nanoscale silver paste of this invention (less than 500 nm and more preferably less than 100 nm in size), it is not necessary to apply such a high pressure to induce sintering and bonding, thus making it a potential drop-in replacement for solder and/or epoxy for die attachment and electrical interconnection. In practice, the pressure used before the silver sintering with the silver paste of the present invention may be used only for better initial interface contacts, and it is recommended that this pressure not exceed 0.1 Mpa so that the silver paste does not get squeezed out (this procedure is very common on solder reflow die-attaching).

TABLE 2

| | Applied Pressure | |
|---|---|---|
| Properties | 10 MPa | 40 MPa |
| Relative Density | 57% | 80% |
| Electrical conductivity $(\Omega \cdot cm)^{-1}$ | $2.6 \times 10^5$ | $4.2 \times 10^5$ |
| Thermal conductivity W/K-m | 30 | 78 |
| Shear Strength MPa | 15 | 50 |

Example 1

Method for Regulating the Densification of Silver by Binder System Composition

Regulation of the densification temperature/rate of the metal particles in the paste of this invention can be achieved by adjusting the type of components that go into the binder system. In particular, it is possible to increase or reduce the firing temperature for any given particle size of the silver (or other metal or metal alloy). For example, if it is desired to increase the effective onset of densification of, for example, a nanosilver paste as discussed above, this can be achieved by substituting the binder system components with alternatives that burn out at higher temperatures to closely match the desired or target peak processing temperature (e.g., the binder system might be chosen to vaporize or otherwise decompose at a temperature that is the same as or slightly below (e.g., within 50° C. or 30° C. or 10° C.) the sintering temperature for the metal or metal alloy particles. This has the added benefit of retaining the nanoscale silver that will quickly densify when the temperature is reached, thus keeping the processing time short.

Figure 7A:
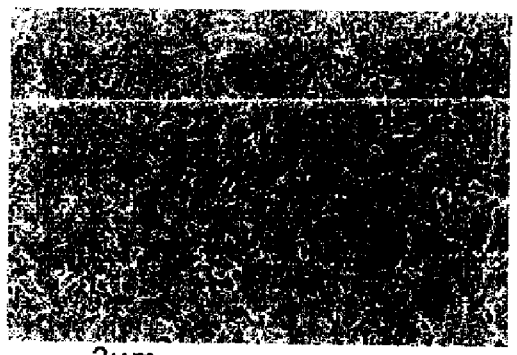
FIGS. 7a and 7b show SEM images of 100 nm silver particles formulated respectively with higher burn out temperature PVB and fatty acid dispersants, and lower burnout temperature PRV914.
Figure 7B:
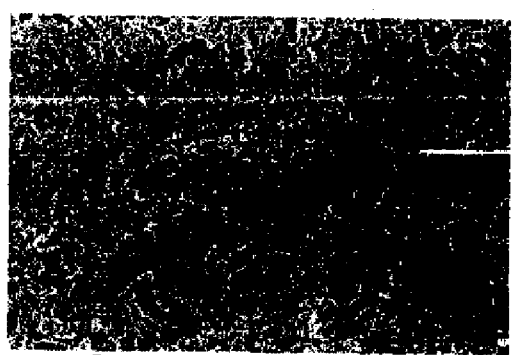

There are applications where the peak processing temperature need not be limited to 300° C. or below. For example, silicon carbide may be attached at temperatures as high as 600° C. using gold or its alloy(s) but with contact pad problems when fired in air. The present technique can be used to make a paste that can be fired at a higher temperature to attain higher density and stronger bonding (but still lower than 600° C. since it is desired to retain the nanosilver particles until the sintering temperature). An illustrative example of this technique is shown in FIGS. 7a-7b where a nanosilver paste containing 100 nm particles and fatty acids of different carbon chain lengths (hence different burnout temperatures) was sintered at 450° C. The fired paste in FIG. 7a had a significantly denser microstructure than that of the paste in FIG. 7b. The higher burn-out temperature of the PVB and longer-chain fatty acid (C-24) in the paste in FIG. 7a prevented the aggregation and sintering reaction of 100 nm particles while still at low temperatures during heating, thus enhancing the densification rate at the sintering temperature. Being able to retain the original particle size (or most of it) while heating to the sintering temperature (thus preventing the annealing out of the energy needed by the sintering process) helped achieve the result.

Example 2

Time-Temperature Heating Profile for Applying Nanosilver Paste Without Pressure

Figures 8A, 8B:
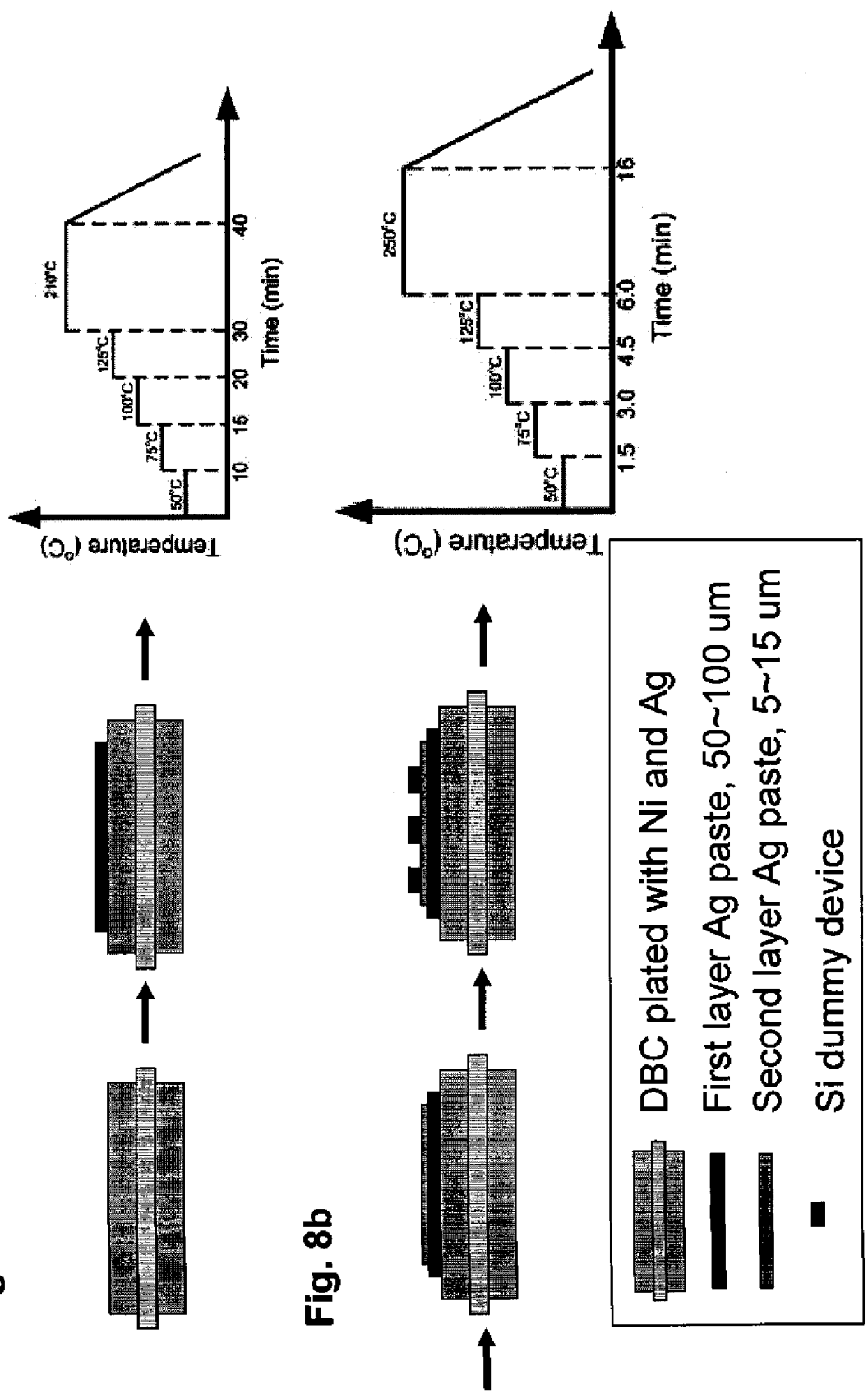
FIGS. 8a and 8b show a schematic of a process for forming a chip attachment without pressure using a specific heating profile.

Electric devices were bonded onto a direct bonded copper (DBC) substrate as shown schematically in FIGS. 8a and 8b.

Step I—FIG. 8a.

Between 50-100 micron (2-4 mil.) of nanosilver paste was stenciled on a DBC substrate plated with nickel and silver. The nanosilver paste was dried using the following temperature profile:

0-10 min.—50° C.
10-15 min.—75° C.
15-20 min.—100° C.
20-30 min.—125° C.
30-40 min.—210° C.

The substrate and nanosilver paste were then allowed to cool to room temperature.

Step II—FIG. 8b.

Another 5-15 micro layer of nanosilver paste was stenciled on top of the dried paste layer. Silicon dummy devices were attached with a smearing motion. The die-attachment was then sintered according to the following temperature profile:

0-1.5 min.—50° C.
1.5-3.0 min.—75° C.
3.0-4.5 min.—100° C.
4.5-6.0 min.—125° C.
6.0-16 min.—250° C.

The die-attachment was then allowed to cool to room temperature.

Example 3

Time-Temperature Heating Profile for Applying Nanosilver Paste With Pressure

Electric devices were bonded onto a DBC substrate as shown schematically in FIGS. 9a and 9b.

Step I—FIG. 9a.

Between 50-100 micron (2-4 mil.) of nanosilver paste was stenciled on a DBC substrate plated with nickel and silver. The nanosilver paste was dried using the following temperature profile:

0-20 min.—50° C.
20-25 min.—75° C.
25-30 min.—100° C.
30-50 min.—125° C.
50-60 min.—150° C.

The substrate and nanosilver paste were then allowed to cool to room temperature.

Step II—FIG. 9b.

Electronic devices were mounted onto the dried nanosilver film. Between 3-5 MPa external pressure was applied and the die-attachment was sintered according to the following temperature profile to form a conductive joint:

0-1.5 min.—50° C.
1.5-3.0 min.—75° C.
3.0-4.5 min.—100° C.
4.5-6.0 min.—125° C.
6.0-16 min.—250° C.

The die-attachment was then allowed to cool to room temperature.

Example 4

Formation and Use of Nanosilver Preform

Figure 10A:
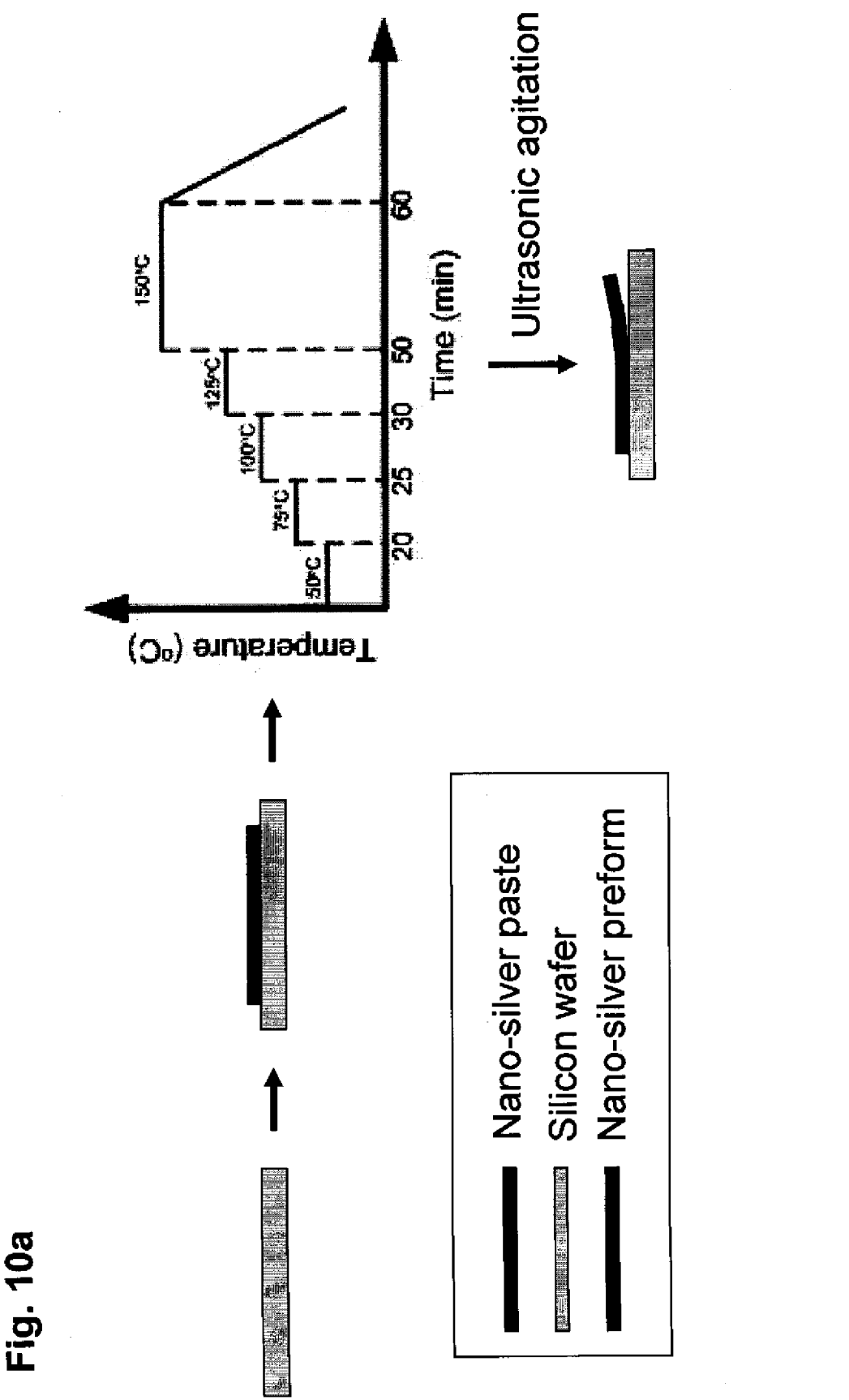
FIGS. 10a and 10b show a schematic of a process for forming a nanosilver preform and using the preform for chip attachment with pressure using a specific heating profile.
Figure 10B:
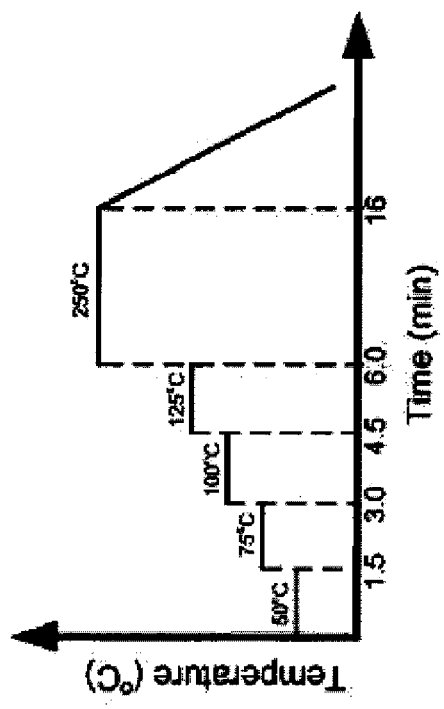
Figure 10B:
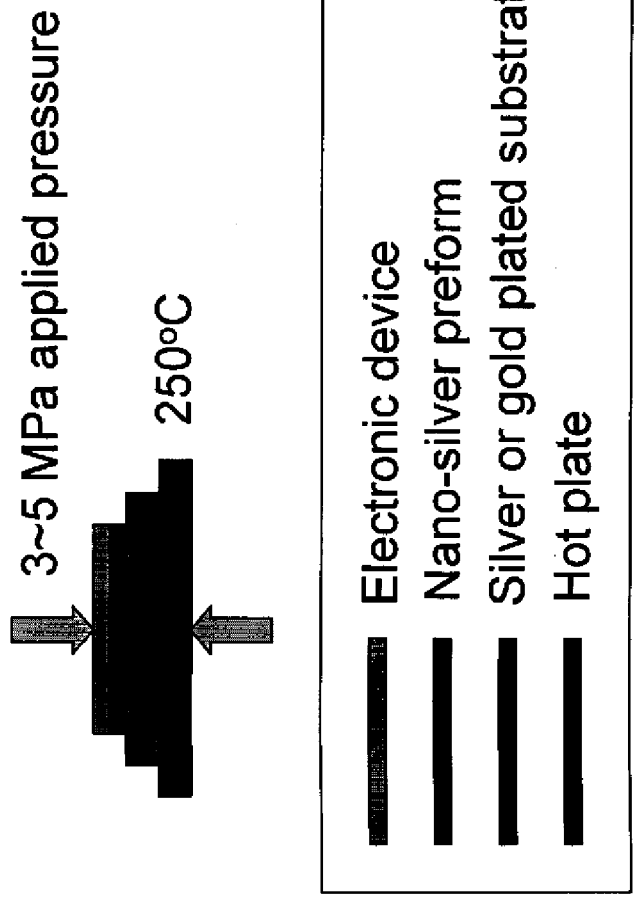

A nanosilver preform was formed and used for chip attachment as shown schematically in FIGS. 10a and 10b.

Step I—FIG. 10a.

Between 50-100 micron (2-4 mil.) of nanosilver paste was stenciled on a polished silicon wafer. The nanosilver paste was dried using the following temperature profile:

0-20 min.—50° C.
20-25 min.—75° C.
25-30 min.—100° C.
30-50 min.—125° C.
50-60 min.—150° C.

The substrate and nanosilver preform were then allowed to cool to room temperature.

The nanosilver preform was then deattached from the silicon wafer using ultrasonic agitation.

Step II—FIG. 10b.

The nanosilver preform was placed on a silver plated substrate. An electronic device was mounted onto the nanosilver preform. Between 3-5 MPa external pressure was applied and the die-attachment was sintered according to the following temperature profile to form a conductive joint:

0-1.5 min.—50° C.
1.5-3.0 min.—75° C.
3.0-4.5 min.—100° C.
4.5-6.0 min.—125° C.
6.0-16 min.—250° C.

The die-attachment was then allowed to cool to room temperature.

While the invention has been described in terms of its preferred embodiments, those skilled in the art will recognize that the invention can be practiced with modification within the spirit and scope of the appended claims.

What is claimed is:

1. A method for forming an interconnect which performs at least one of mechanically, thermally or electrically connecting a device to a substrate, the method comprising:
    applying a nanoscale metal paste to the substrate;
    drying the nanoscale paste by heating for a series of drying periods of time each ranging from 1 to 20 minutes and each drying period of time having a constant holding temperature that is an incremental temperature increase over the constant holding temperature of the previous drying period of time, until a peak drying constant holding temperature is reached;
    maintaining the peak drying constant holding temperature for a peak drying period of time sufficient to complete drying of the nanoscale metal paste;

placing a device in contact with the dried nanoscale metal paste;

sintering the nanoscale paste by heating for a series of sintering periods of time each ranging from 30 seconds to 10 minutes and each sintering period of time having a constant holding temperature that is an incremental temperature increase over the constant holding temperature of the previous sintering period of time, until a peak sintering constant holding temperature is reached; and maintaining the peak sintering constant holding temperature for a peak sintering period of time sufficient to form the electrical interconnect.

2. The method of claim 1, wherein 1 to 10 MPa of pressure is applied to the device during the sintering periods of time.

3. The method of claim 1, wherein 1 MPa to 10 MPa of pressure is applied to the device during the peak sintering period of time.

4. The method of claim 1, wherein the peak drying constant holding temperature is less than 250° C.

5. The method of claim 1, wherein the peak drying period of time is 1 to 30 minutes.

6. The method of claim 1, wherein the incremental temperature increases between drying periods are between 5° and 150° C.

7. The method of claim 1, wherein the peak sintering constant holding temperature is more than 250° C.

8. The method of claim 1, wherein the peak sintering period of time is 1 to 30 minutes.

9. The method of claim 1, wherein the incremental temperature increases between sintering periods are between 5° and 150° C.

10. The method of claim 1, wherein the nanoscale metal paste comprises:

metal or metal alloy powder composed of a plurality of particles of a particle size of 500 nm or less;

a dispersant associated with particles of the metal or metal alloy powder, the dispersant being present in sufficient quantity to reduce or prevent agglomeration of the particles of the metal or metal alloy powder; and a binder having a temperature of volatilization below the sintering temperature of the metal or metal alloy powder.

11. A method for forming a nanoscale metal preform, comprising:

applying a nanoscale metal paste to a substrate;

drying the nanoscale paste by heating for a series of drying periods of time each ranging from 1 to 20 minutes and each drying period of time having a constant holding temperature that is an incremental increase over the constant holding temperature of the previous drying period of time, until a peak drying constant holding temperature is reached;

maintaining the peak drying constant holding temperature for a peak drying period of time sufficient to complete drying of the nanoscale metal paste; and removing the dried nanoscale paste from the substrate to obtain the dried nanoscale metal preform.

12. The method of claim 11, wherein the peak drying constant holding temperature is less than 250° C.

13. The method of claim 11, wherein the substrate is a polished silicon wafer.

14. The method of claim 11, wherein the dried nanoscale metal paste is removed from the substrate by ultrasonic agitation.

15. The method of claim 11, wherein the dried nanoscale metal paste is removed from the substrate by floating the dried nanoscale metal paste with a liquid.

16. The method of claim 11, wherein the dried nanoscale metal paste is removed from the substrate by physically contacting the dried nanoscale metal paste.

* * * * *